(12) United States Patent
Harada

(10) Patent No.: US 12,035,571 B2
(45) Date of Patent: Jul. 9, 2024

(54) DISPLAY DEVICE

(71) Applicant: Japan Display Inc., Tokyo (JP)

(72) Inventor: Kenji Harada, Tokyo (JP)

(73) Assignee: Japan Display Inc., Tokyo (JP)

( * ) Notice: Subject to any disclaimer, the term of this patent is extended or adjusted under 35 U.S.C. 154(b) by 358 days.

(21) Appl. No.: 17/578,536

(22) Filed: Jan. 19, 2022

(65) Prior Publication Data

US 2022/0231100 A1  Jul. 21, 2022

(30) Foreign Application Priority Data

Jan. 21, 2021 (JP) .................................. 2021-008036

(51) Int. Cl.
 *H10K 59/122* (2023.01)
 *H10K 50/822* (2023.01)

(52) U.S. Cl.
 CPC ......... *H10K 59/122* (2023.02); *H10K 50/822* (2023.02)

(58) Field of Classification Search
 None
 See application file for complete search history.

(56) References Cited

U.S. PATENT DOCUMENTS

| 2015/0179718 A1* | 6/2015 | Kim ..................... H10K 50/824 |
| | | 438/34 |
| 2015/0279915 A1 | 10/2015 | Morita et al. |
| 2017/0207285 A1* | 7/2017 | You ..................... H10K 50/822 |
| 2017/0250367 A1 | 8/2017 | Yasukawa |

FOREIGN PATENT DOCUMENTS

| JP | 2008-135325 A | 6/2008 |
| JP | 2009-244527 A | 10/2009 |

OTHER PUBLICATIONS

Office Action dated Oct. 21, 2022, in corresponding Indian Application No. 202214003120, 5 pages.

* cited by examiner

*Primary Examiner* — Michelle Mandala
(74) *Attorney, Agent, or Firm* — Maier & Maier, PLLC

(57) ABSTRACT

According to one embodiment, a display device includes a base, a first insulating layer, first and second lower electrodes, a second insulating layer including a first opening, a second opening, and a first trench, an organic layer including a light-emitting layer and an upper electrode, and the first trench includes a bottom surface and first and second side surfaces, an interval between the first side surface and the second side surface in an upper portion of the first trench is smaller than that in the bottom surface, and the organic layer includes a first portion covering the first lower electrode, a second portion covering the second lower electrode and a third portion disposed on the bottom surface.

8 Claims, 9 Drawing Sheets

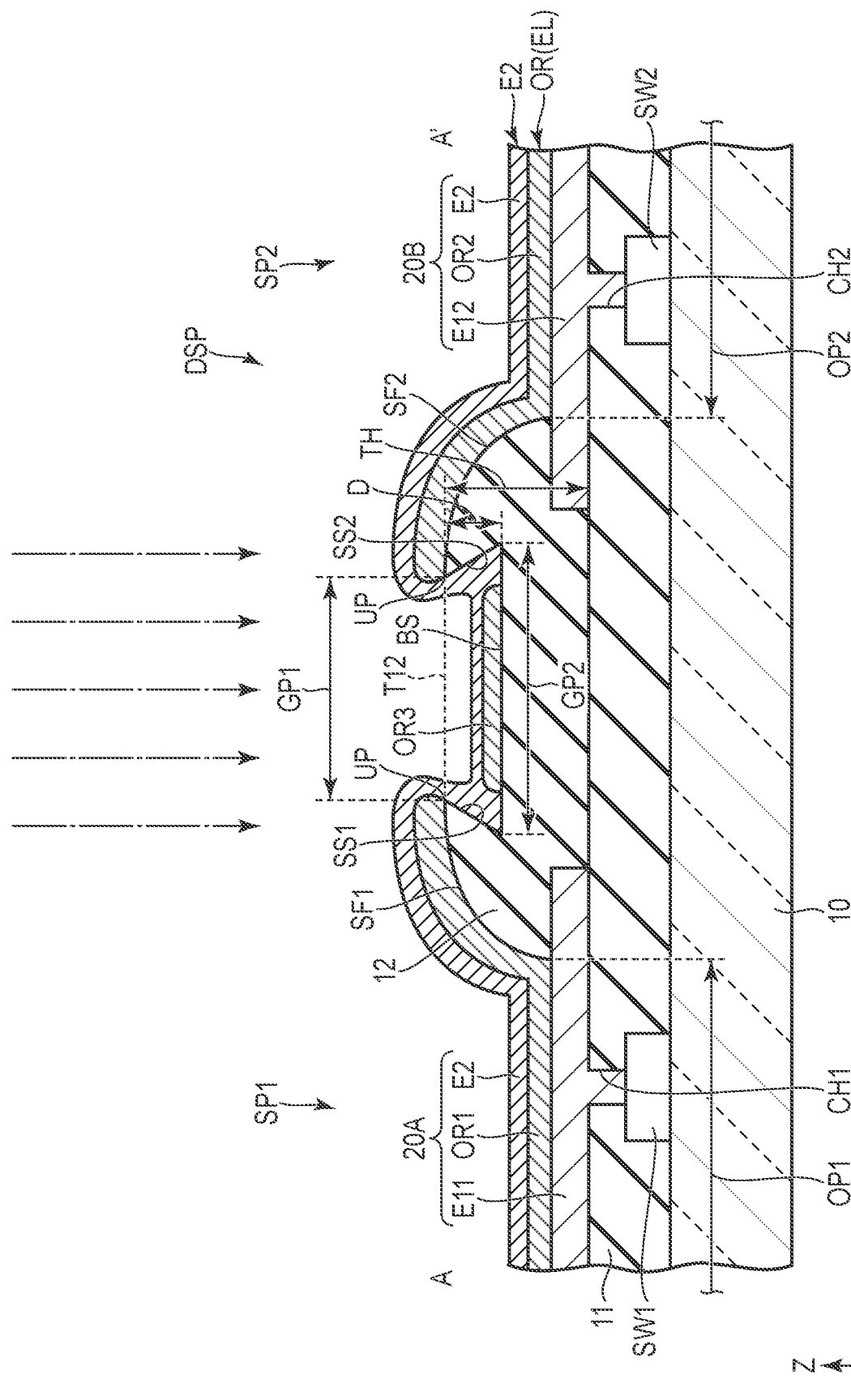
F I G. 3

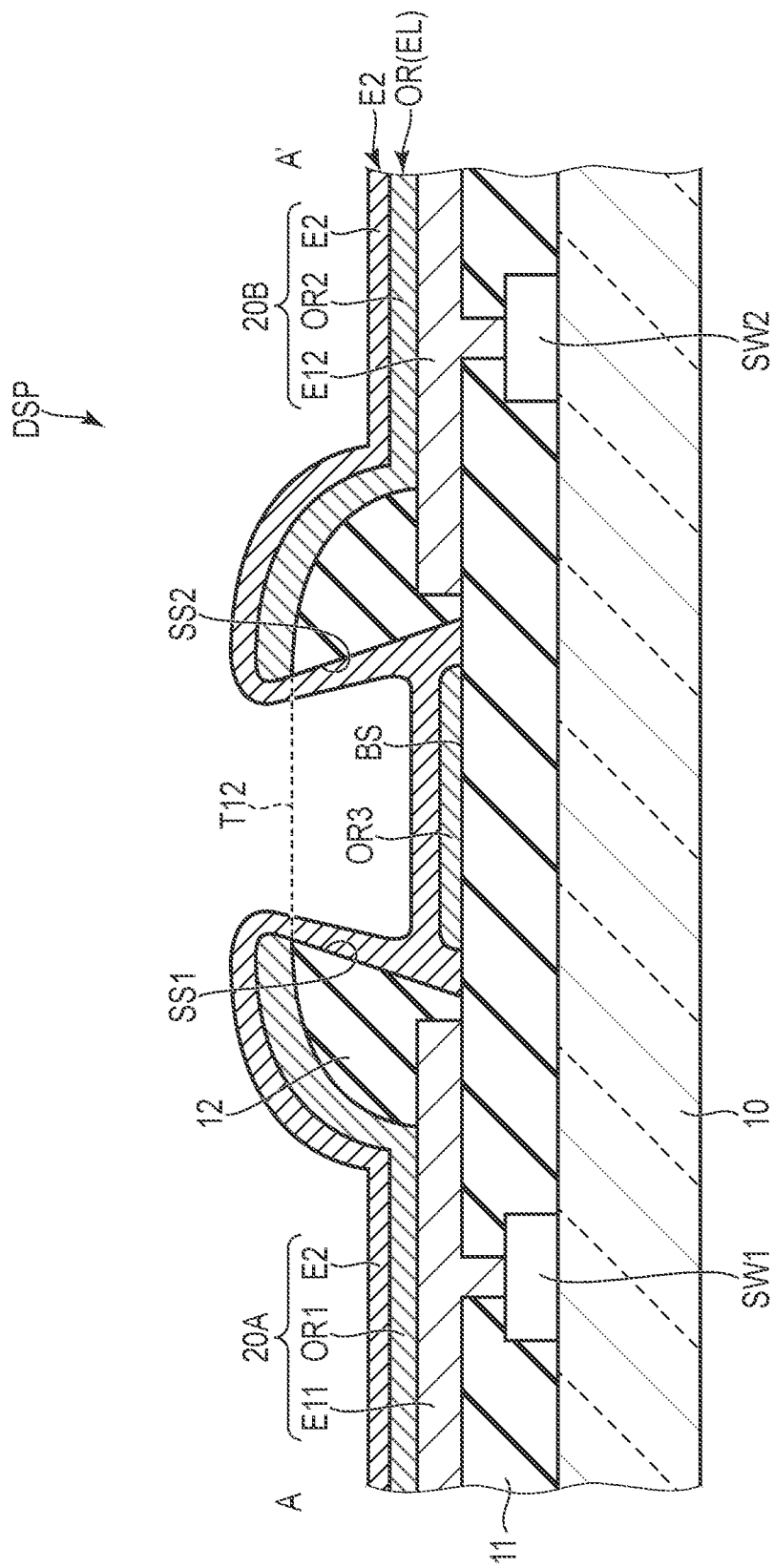
F I G. 7

DISPLAY DEVICE

CROSS-REFERENCE TO RELATED APPLICATIONS

This application is based upon and claims the benefit of priority from Japanese Patent Application No. 2021-008036, filed Jan. 21, 2021, the entire contents of which are incorporated herein by reference.

FIELD

Embodiments described herein relate generally to a display device.

BACKGROUND

In recent years, display devices in which organic light-emitting diodes (OLEDs) are applied as display elements have been used in practical applications. The display elements comprise an organic layer between a pixel electrode and a common electrode. The organic layer includes, in addition to the light-emitting layer, functional layers such as a hole transport layer and an electron transport layer. Such an organic layer is formed, for example, by the vacuum deposition method.

The organic layer should desirably be divided into sections for respective pixels in order to suppress crosstalk between adjacent pixels, for example. As a method to divide the organic layer into separate divisions for respective pixels, for example, a vapor deposition method which does not use a mask has been studied.

BRIEF DESCRIPTION OF THE DRAWINGS

FIG. 3 is a cross-sectional view of the display device taken along line A-A' shown in FIG. 2.

FIG. 4 is a cross-sectional view showing a trench, an organic layer and the like.

FIG. 7 is a cross-sectional view showing the first modified example of this embodiment.

DETAILED DESCRIPTION

Figure 1:
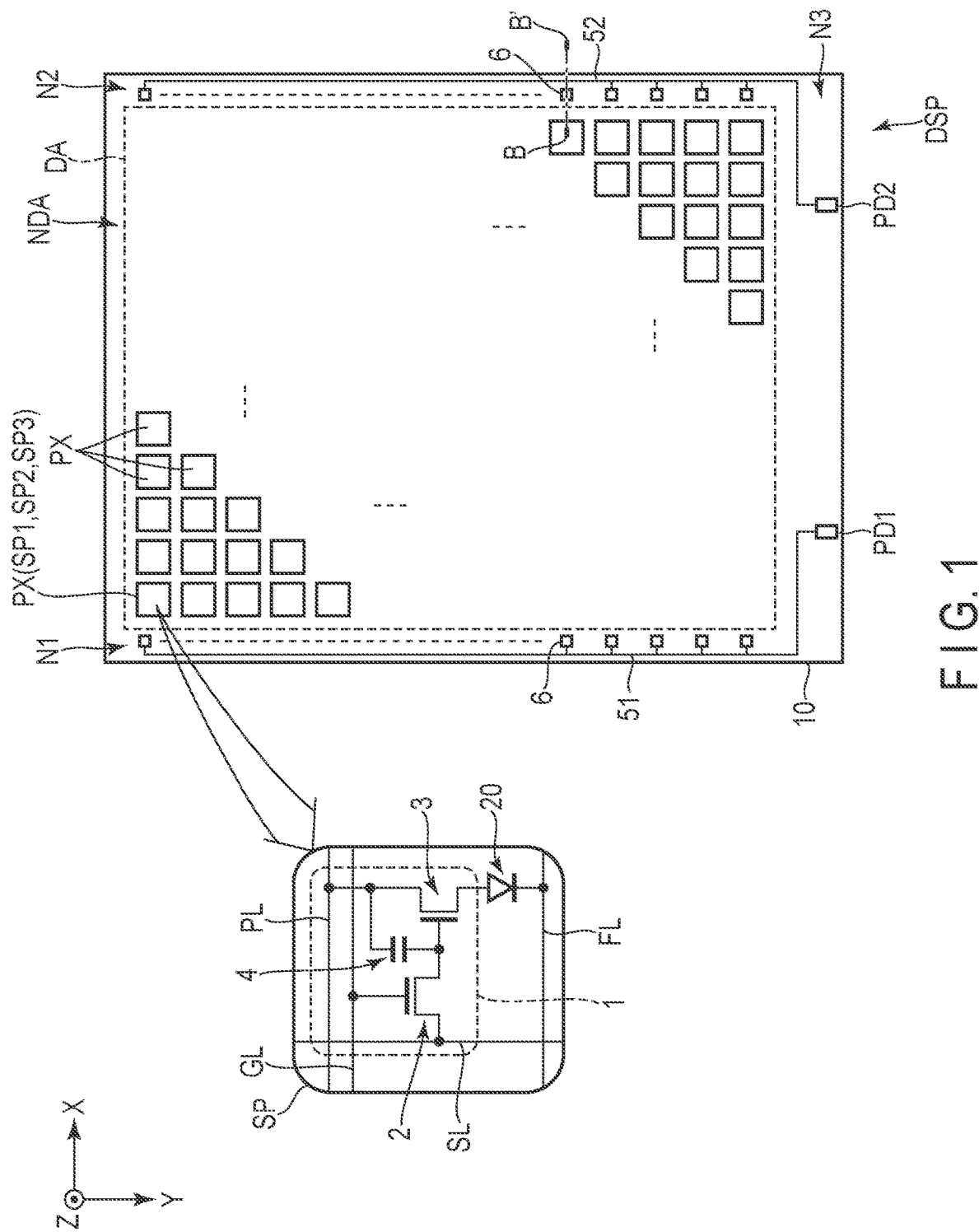
FIG. 1 is a plan view showing a configuration example of a display device according to one embodiment.

In general, according to one embodiment, a display device comprises a base, a first insulating layer disposed on the base, a first lower electrode and a second lower electrode, disposed on the first insulating layer, a second insulating layer disposed on the first insulating layer and including a first opening overlapping the first lower electrode, a second opening overlapping the second lower electrode, and a first trench located between the first opening and the second opening, an organic layer including a light-emitting layer and an upper electrode covering the organic layer, and the first trench includes a bottom surface and first and second side surfaces rising from the bottom surface, an interval between the first side surface and the second side surface in an upper portion of the first trench is smaller than an interval between the first side surface and the second side surface in the bottom surface of the first trench, and the organic layer includes a first portion covering the first lower electrode located in the first opening and covering the first surface of the second insulating layer located between the first trench and the first opening, a second portion covering the second lower electrode located in the second opening and covering the second surface of the second insulating layer located between the first trench and the second opening and a third portion disposed on the bottom surface of the first trench and spaced apart from the first portion and the second portion.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

The display device DSP of this embodiment is an organic electroluminescent display device comprising an organic light-emitting diode (OLED) as a display element, and can be mounted on televisions, personal computers, mobile terminals, cell phones and the like.

FIG. 1 is a plan view showing an example configuration of a display device DSP of this embodiment.

Some of the drawings illustrate a first direction X, a second direction Y and a third direction Z which are orthogonal to each other, but they may intersect at an angle other than 90 degrees. In the following descriptions, a direction forwarding a tip of an arrow indicating the third direction Z is referred to as "upward" and a direction forwarding oppositely from the tip of the arrow is referred to as "downward". Further, it is assumed that there is an observation position to observe the semiconductor substrate on a tip side of an arrow in the third direction Z, and viewing from this observation position toward the X-Y plane defined by the first direction X and the second direction Y is referred to as a planar view.

The display device DSP comprises an insulating base 10. The base 10 may be glass or a flexible resin film. The display device DSP includes a display area DA where images are displayed and a non-display area NDA around the display area DA.

The display device DSP comprises a plurality of pixels PX arranged in a matrix along the first direction X and the second direction Y in the display area DA. The pixels PX each comprises a plurality of subpixels SP1, SP2 and SP3. For example, each pixel PX comprises a red subpixel SP1, a green subpixel SP2 and a blue subpixel SP3. In place of the three subpixels of the three colors, the pixel PX may contain four or more subpixels of other colors, including white.

A configuration example of one subpixel SP contained in a pixel PX will be briefly described.

That is, the subpixel SP comprises a pixel circuit 1 and a display element 20 that is driven and controlled by the pixel circuit 1. The pixel circuit 1 comprises a pixel switch 2, a drive transistor 3 and a capacitor 4. The pixel switch 2 and the drive transistor 3 are switch elements constituted by thin-film transistors, for example.

In the pixel switch 2, a gate electrode thereof is connected to a scanning line GL, a source electrode is connected to a signal line SL and a drain electrode is connected to one of the electrodes constituting the capacitor 4 and the gate electrode of the drive transistor 3. In the drive transistor 3, a source electrode thereof is connected to the other electrode of the capacitor 4 and a power line PL, and a drain electrode is connected to an anode of the display element 20. A cathode of the display element 20 is connected to a power feed line FL. Note that the configuration of the pixel circuit 1 is not limited to that of the example shown in the figure.

The display element 20 is an organic light-emitting diode (OLED), which is a light-emitting element. For example, a subpixel SP1 comprises a display element that emits light corresponding to the red wavelength, a subpixel SP2 comprises a display element that emits light corresponding to the green wavelength, and a subpixel SP3 comprises a display element that emits light corresponding to the blue wavelength. The configuration of the display element 20 will be described later.

The display device DSP comprises power lines 51 and 52 located in the non-display area NDA, a plurality of peripheral electrodes 6, and pads PD1 and PD2. The non-display area NDA includes a first area N1 and a second area N2, extending along the second direction Y, and a third area N3 extending in the first direction X. The first area N1, the display area DA and the second area N2 are aligned along the first direction X in this order. On the third area N3, a flexible wiring board (not shown) is mounted.

The power line 51 is located in the first area N1, and the power line 52 is located in the second area N2. The peripheral electrodes 6 are aligned along the second direction Y in each of the first and second regions N1 and N2. The pads PD1 and PD2 are located in the third area N3.

The power line 51 is electrically connected to peripheral electrodes 6 located in the first area N1. The power line 51 is electrically connected to the pad PD1 as well. The power line 52 is electrically connected to peripheral electrodes 6 located in the second area N2. The power line 52 is electrically connected to the pad PD2 as well.

Figure 2:
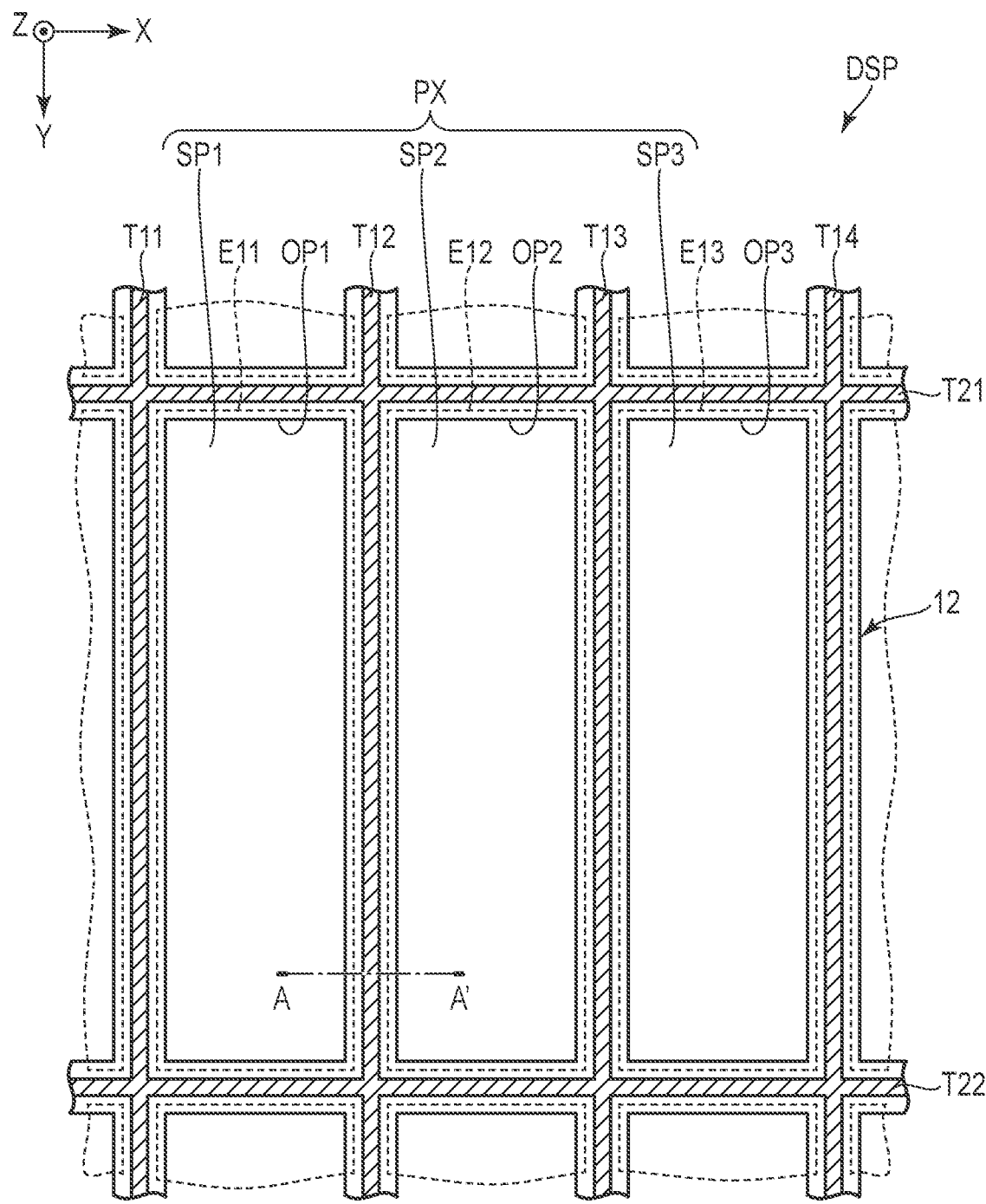
FIG. 2 is a plan view of a pixel.

FIG. 2 is a plan view showing a pixel PX.

FIG. 2 illustrates lower electrodes E11, E12 and E13 of the display device DSP and the insulating layer 12.

The lower electrode (first lower electrode) E11 is located in the subpixel SP1. The lower electrode (second lower electrode) E12 is located in the subpixel SP2. The lower electrode E13 is placed in the subpixel SP3. The lower electrodes E11 to E13 are aligned along the first direction X. The lower electrodes, including the lower electrodes E11 to E13, are electrodes each arranged for each respective subpixel or each respective display element, and may be referred to as pixel electrodes, anodes or the like.

The insulating layer 12 is formed into a grid pattern in planar view. The insulating layer 12 is formed in such a manner that it is partitioned into display elements or subpixels, and it may be referred to as ribs, partition walls, etc. The insulating layer 12 comprises a first opening OP1 overlapping the lower electrode E11, a second opening OP2 overlapping the lower electrode E12, and a third opening OP3 overlapping the lower electrode E13. The insulating layer 12 covers the peripheral portion of each of the lower electrodes E11 and E13, thus exposing a central portion of each of the lower electrodes E11 to E13 from the insulating layer 12 in the first opening OP1, the second opening OP2 and the third opening OP3.

The insulating layer 12 comprises trenches T11, T12, T13 and T14 extending along the second direction Y and aligned along the first direction X, and trenches T21 and T22 extending along the first direction X and aligned along the second direction Y. The trench (first trench) T12 is located between the first opening OP1 and the second opening OP2. The trench T13 is located between the second opening OP2 and the third opening OP3. The trench T11 is located on an opposite side to the trench T12 while interposing the first opening OP1 therebetween. The trench T14 is located on an opposite side to the trench T13 while interposing the third opening OP3. The trench T21 is connected to the trenches T11 to T14. The trench T22 as well is connected to the trenches T11 to T14. The trench T21 is located on an opposite side to the trench T22 while interposing the first opening OP1, the second opening OP2 and the third opening OP3 therebetween.

Each trench does not overlap a lower electrode adjacent thereto in plan view. The lower electrode E11 is located between the trenches T11 and T12, the lower electrode E12 is located between the trenches T12 and T13, and the lower electrode E13 is located between the trenches T13 and T14. The lower electrodes E11 through E13 are located between the trenches T21 and T22.

Here, the outline of the subpixel corresponds to the outline of the lower electrode, for example. That is, the subpixels SP1, SP2 and SP3, which constitute one pixel PX, are each formed in a substantially rectangular shape elongating along the second direction Y, and are aligned along the first direction X. The colors of the light emitted from adjacent subpixels aligned along the first direction X are different from each other. The areas of the subpixels SP1, SP2 and SP3 may be the same as or may be different from each other, as will be described below. The outline of each subpixel may be defined by the outline of the light-emitting area of the display element.

FIG. 3 is a cross-sectional view of the display device DSP taken along line A-A' shown in FIG. 2.

The display device DSP comprises a base 10, switching elements SW1 and SW2, an insulating layer 11, lower electrodes E11 and E12, an insulating layer 12, an organic layer OR and an upper electrode E2. The display element 20A is constituted by the lower electrode E11, a first portion OR1 of the organic layer OR and the upper electrode E2. The display element 20B is constituted by the lower electrode E12, a second portion OR2 of the organic layer OR and the upper electrode E2.

The switching elements SW1 and SW2 are disposed on the base 10. The switching elements SW1 and SW2 correspond, for example, to the drive transistor 3 shown in FIG. 1. The insulating layer (first insulating layer) 11 is disposed on the base 10 and covers the switching elements SW1 and SW2. The insulating layer 11 corresponds to an underlying layer of the display elements 20A and 20B, and is, for example, an organic insulating layer. Note that the pixel switch 2 of the pixel circuit 1 and the like shown in FIG. 1 are disposed on the base 10 and covered by the insulating layer 11, but the illustration thereof is omitted here.

The lower electrodes E11 and E12 are disposed on the insulating layer 11. The lower electrode E11 is electrically connected to the switching element SW1 via a contact hole CH1 formed in the insulating layer 11. The lower electrode E12 is electrically connected to the switching element SW2 via a contact hole CH2 formed in the insulating layer 11.

The lower electrodes E11 and E12 are transparent electrodes formed, for example, of a transparent conductive material such as indium tin oxide (ITO) or indium zinc oxide (IZO). The lower electrodes E11 and E12 may each be a metal electrode formed of a metal material such as silver or aluminum. Or, the lower electrodes E11 and E12 each may as well be a stacked body of a transparent electrode and a metal electrode. For example, the lower electrodes E11 and 512 may each be configured as a stacked body in which a transparent electrode, a metal electrode and a transparent electrode are stacked in this order, or may be configured as a stacked body consisting of three or more layers.

The insulating layer (second insulating layer) 12 is disposed on the insulating layer 11 and covers the peripheral portions of the lower electrodes E11 and E12, respectively. The insulating layer 12 is, for example, an organic insulating layer. The insulating layer 12 comprises the first opening OP1, the second opening OP2 and the trench T12, described above, and a first surface SF1 and a second surface SF2. The first opening OP1 penetrates the insulating layer 12 to the lower electrode E11. The second opening OP2 penetrates the insulating layer 12 to the lower electrode E12. The first surface SF1 is located between the trench T12 and the first opening OP1. The second surface SF2 is located between the trench T12 and the second opening OP2. The insulating layer 12 has a thickness TH. The thickness TH corresponds to the distance between the highest position of the insulating layer 12 and the insulating layer 11 in the example illustrated in the figure, and is, for example, 1.5 to 2.0 µm.

The trench T12 includes a bottom surface BS, and first and second side surfaces SS1 and SS2 rising from the bottom surface BS. The first and second side surfaces SS1 and SS2 oppose each other with an interval therebetween along the first direction X. The first side surface SS1 is connected to the first surface SF1. The second side surface SS2 is connected to the second surface SF2. The trench T12 corresponds to the space surrounded by the first side surface SS1, the second side surface SS2 and the bottom surface BS. The trench T12 has a depth D. The depth D is, for example, 0.5 to 1.0 µm.

The trench T12 comprises a gap GP1 between the first side surface SS1 and the second side surface SS2 in its upper portion UP, and a gap GP2 between the first side surface SS1 and the second side surface SS2 in its bottom surface BS. The gap GP1 is less than the gap GP2. That is, the trench T12 is formed such that the width along the first direction X decreases as its location is closer to the upper portion UP from the bottom surface BS. In other words, the first side surface SS1 is inclined to the normal direction of the bottom surface BS so as to overlap the bottom surface BS. Similarly, the second side surface SS2 is inclined in the normal direction to the bottom surface BS so as to overlap the bottom surface BS.

The organic layer OR includes a first portion OR1, a second portion OR2 and a third portion OR3. The first portion OR1 covers the lower electrode E11 located in the first opening OP1 and the first surface SF1. The second portion OR2 covers the lower electrode E12 located in the second opening OP2 and the second surface SF2. The third portion OR3 is located on the bottom surface BS of the trench T12. The third portion OR3 is separated from the first portion OR1 and the second portion OR2. The organic layer OR includes a light-emitting layer EL as described below, and the first portion OR1, the second portion OR2 and the third portion OR3 include light-emitting layers EL of the same color. Further, the organic layer OR includes, in addition to the light-emitting layer EL, at least one of a hole injection layer, a hole transport layer, an electron injection layer, and an electron transport layer.

The upper electrode E2 covers the organic layer OR. That is, the upper electrode E2 covers each of the first portion OR1, the second portion OR2 and the third portion OR3. The upper electrode E2 covers the third portion OR3 inside the trench T12 and is in contact with the bottom surface BS. Further, the upper electrode E2 is also in contact with the first side surface SS1 and the second side surface SS2 inside the trench T12. The upper electrode E2 is a transparent electrode formed of a transparent conductive material such as ITO or IZO. The upper electrode E2 is electrically connected to the power feed line FL located in the display area DA shown in FIG. 1. The upper electrode E2 is an electrode commonly provided for multiple subpixels or multiple display elements, and may be referred to as a common electrode, counter electrode, cathode or the like. The upper electrode E2 may be covered by a transparent protective layer (including at least one of an inorganic insulating layer and an organic insulating layer).

In the display element 20A, the first portion OR1 is located between the lower electrode E11 and the upper electrode E2 and thus can form a light-emitting region. In the display device 20B, the second portion OR2 is located between the lower electrode E11 and the upper electrode E2, and thus can form a light-emitting region. The third portion OR3 is located between the insulating layer 12 and the upper electrode E2, and is completely separated from the first portion OR1 and the second portion OR2; therefore it does not emit light. Further, of the first portion OR1, the region that covers the first surface SF1 emits substantially no light because it is located between the insulating layer 12 and the upper electrode E2. Similarly, of the second portion OR2, the region that covers the second surface SF2 emits substantially no light because it is located between the insulating layer 12 and the upper electrode E2.

The organic layer OR described above is formed, for example, by the vacuum deposition method. The figure illustrates by single-dotted chain lines, how the organic material to form the organic layer OR is ejected from the deposition source.

After forming the insulating layer 12 provided with the first opening OP1, the second opening OP2 and the trench T12, the organic material to form the organic layer OR is deposited. Since the first side surface SS1 is inclined so as to overlap the bottom surface BS, the organic layer OR is not substantially formed on the first side surface SS1. Thus, the organic layer OR is formed such that the first portion OR1 and the third portion OR3 are separated from each other. Similarly, since the second side surface SS2 is inclined to overlap the bottom surface BS, substantially no organic layer OR is formed on the second side surface SS2. Thus, the organic layer OR is formed such that the second portion OR2 and the third portion OR3 are separated from each other. Further, in the region of the bottom surface BS that overlaps the first side surface SS1 and the second side surface SS2 along the third direction Z, substantially no organic layer OR is formed. Note that the upper electrode E2 is formed by sputtering, and therefore it is continuously formed on the organic layer OR, the bottom surface BS, the first side surface SS1 and the second side surface SS2.

According to this embodiment, the insulating layer 12 includes the trench T12. Further, the trench T12 is formed such that the width along the first direction X decreases as the location closer to the upper portion UP from the bottom surface BS. With this structure, the organic layer OR can be formed in the trench T12 such that the first portion OR1 located in the subpixel SP1 and the second portion OR2 located in the subpixel SP2 are separated from each other. In other words, the organic layer OR can be formed separately for each subpixel by an entire surface deposition without using a mask. Thus, it is possible to suppress crosstalk between adjacent subpixels. Further, separate members for separating the organic layers OR from each other are not necessary, and therefore the manufacturing cost can be reduced.

Note that the interval between the first side surface SS1 and the second side surface SS2 can be rephrased as the width of the trench T12. In the example illustrated in FIG. 3, the first side surface SS1, the second side surface SS2, and the bottom surface BS are flat surfaces, but they may as well be curved surfaces. When the first side surface SS1, the second side surface SS2, and the bottom surface BS are flat, the maximum width of the trench T12 is equivalent to the width of the bottom surface BS. But, when the first side surface SS1, the second side surface SS2, and the bottom surface BS include curved surfaces, the maximum width of the trench T12 does not necessarily correspond to the width of the bottom surface BS, and the width of the trench T12 may be maximum above the bottom surface BS. In this case, for example, the width of the trench T12 becomes maximum at a position of ½ or less or even ⅓ or less of the height of the trench T12.

When the potentials of the lower electrodes E11 and E12 are relatively higher than that of the upper electrode E2, the lower electrodes E11 and E12 correspond to the anodes and the upper electrode E2 corresponds to the cathode. When the potential of the upper electrode E2 is relatively higher than those of the lower electrodes E11 and E12, the upper electrode E2 corresponds to the anode and the lower electrodes E11 and E12 correspond to the cathode.

For example, in all subpixels SP in the display area DA, an organic layer OR including light-emitting layers EL of the same color is disposed. When the light-emitting color of the display elements is white, a multi-color display can be realized by disposing a color filter to oppose the display elements. When the light-emitting color of each display element is ultraviolet light, a multi-color display can be realized by disposing a photo-conversion layer to oppose the display elements.

Figure 4:
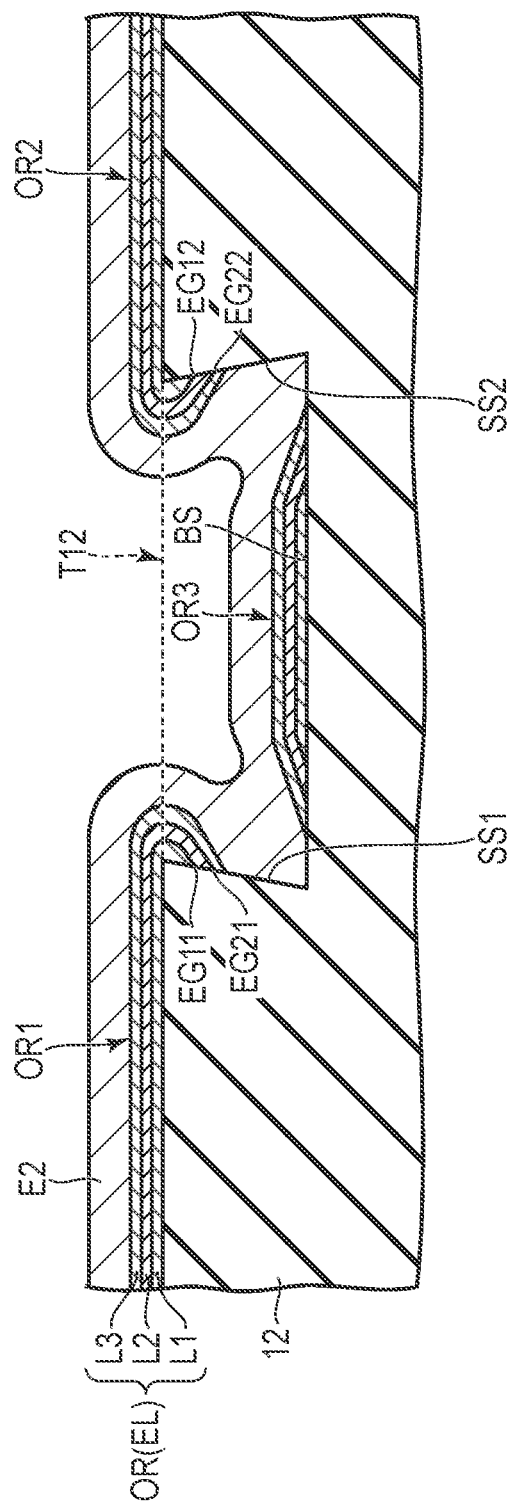

FIG. 4 is a cross-sectional view showing the trench T12, the organic layer OR, etc.

The organic layer OR includes a first layer L1, a second layer L2 and a third layer L3, stacked on one another. That is, the first portion OR1, the second portion OR2 and the third portion OR3 includes the first layer L1, the second layer L2 and the third layer L3, stacked one on another, respectively. As described above, the organic layer OR includes the light-emitting layer EL. For example, the light-emitting layer EL is any one of the first layer L1, the second layer L2 and the third layer L3.

The first portion OR1 is in contact with the first side surface SS1. In the first side surface SS1, an edge portion EG11 of the first layer L1 is covered by the second layer L2, and an edge portion EG21 of the second layer L2 is covered by the third layer L3. The second portion OR2 is in contact with the second side surface SS2. In the second side surface SS2, an edge portion EG12 of the first layer L1 is covered by the second layer L2, and an edge portion EG22 of the second layer L2 is covered by the third layer L3.

In this embodiment, the first side surface SS1 and the second side surface SS2 are each inclined to overlap with the bottom surface BS, and therefore the second layer L2 is deposited to cover the first layer L1 and the third layer L3 is deposited to cover the second layer L2. With this configuration, it is possible to suppress the first layer L1 and the second layer L2 from being exposed from the third layer L3, and the upper electrode E2 can be suppressed from coming into contact with the first layer L1 and the second layer L2. Therefore, the leakage of current from the first and second layers L1 and L2 to the upper electrode E2 is suppressed, thus making it possible to suppress the degradation performance of the display element.

Here, let us suppose, for example, that the first layer L1 and the third layer L3 are functional layers and the second layer L2 is a light-emitting layer EL. The first layer L1 and the third layer L3 are, for example, a hole injection layer, a hole transport layer, a hole blocking layer, an electron injection layer, an electron transport layer, and an electron blocking layer, but they may as well be other functional layers. Each of the first layer L1 and the third layer L3 is not limited to a single layer, but may as well be a stacked body in which multiple functional layers are stacked. Further, at least one of the first layer L1 and the third layer L3 may be omitted.

For example, when the lower electrode corresponds to an anode, the first layer L1 between the light-emitting layer EL and the lower electrode includes at least one of a hole injection layer and a hole transport layer, and the third layer L3 between the light-emitting layer EL and the upper electrode E2 includes at least one of an electron transport layer and an electron injection layer.

Figure 5:
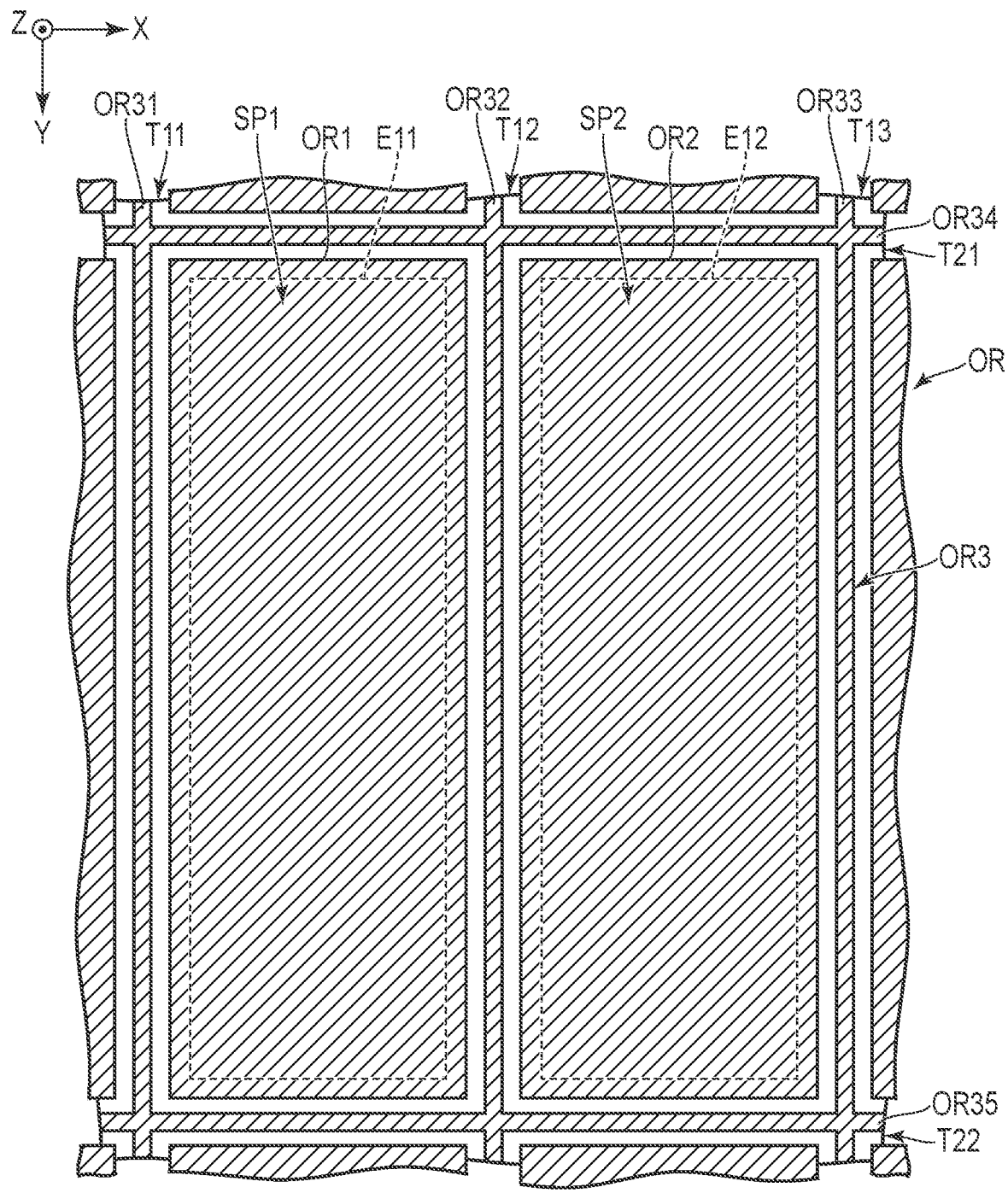
FIG. 5 is a plan view showing the organic layer.

FIG. 5 is a plan view of the organic layer OR. In FIG. 5, the region where the organic layer OR is disposed is indicated by shaded lines.

The first portion OR1 is disposed in the subpixel SP1. The second portion OR2 is disposed in the subpixel SP2. The first portion OR1 and the second portion OR2 are aligned along the first direction X.

The third portion OR3 is formed into a grid pattern in planar view. The third portion OR3 includes parts OR31, OR32 and OR33 extending along the second direction Y and aligned along the first direction X, and parts OR34 and OR35 extending along the first direction X and aligned along the second direction Y. The part OR32 is located between the first portion OR1 and the second portion OR2. The part OR31 is located on an opposite side to the part OR32 while interposing the first portion OR1 therebetween. The part OR33 is located on an opposite side to the part OR32 while interposing the second portion OR2. The part OR34 is connected to the portions OR31 and OR33. The part OR35 is connected to the portions OR31 and OR33. The part OR34 is located on an opposite side to the part OR35 while interposing the first portion OR1 and the second portion OR2 therebetween.

The parts OR31 to OR33 are located in the trenches T11 to T13, respectively. Further, the parts OR34 and OR35 are located in the trenches T21 and T22, respectively.

Note that the outer shape of the first portion OR1 is greater in size than that of the lower electrode E11 in planar view. The outer shape of the second portion OR2 is greater in size than that of the lower electrode E12 in planar view.

Figure 6:
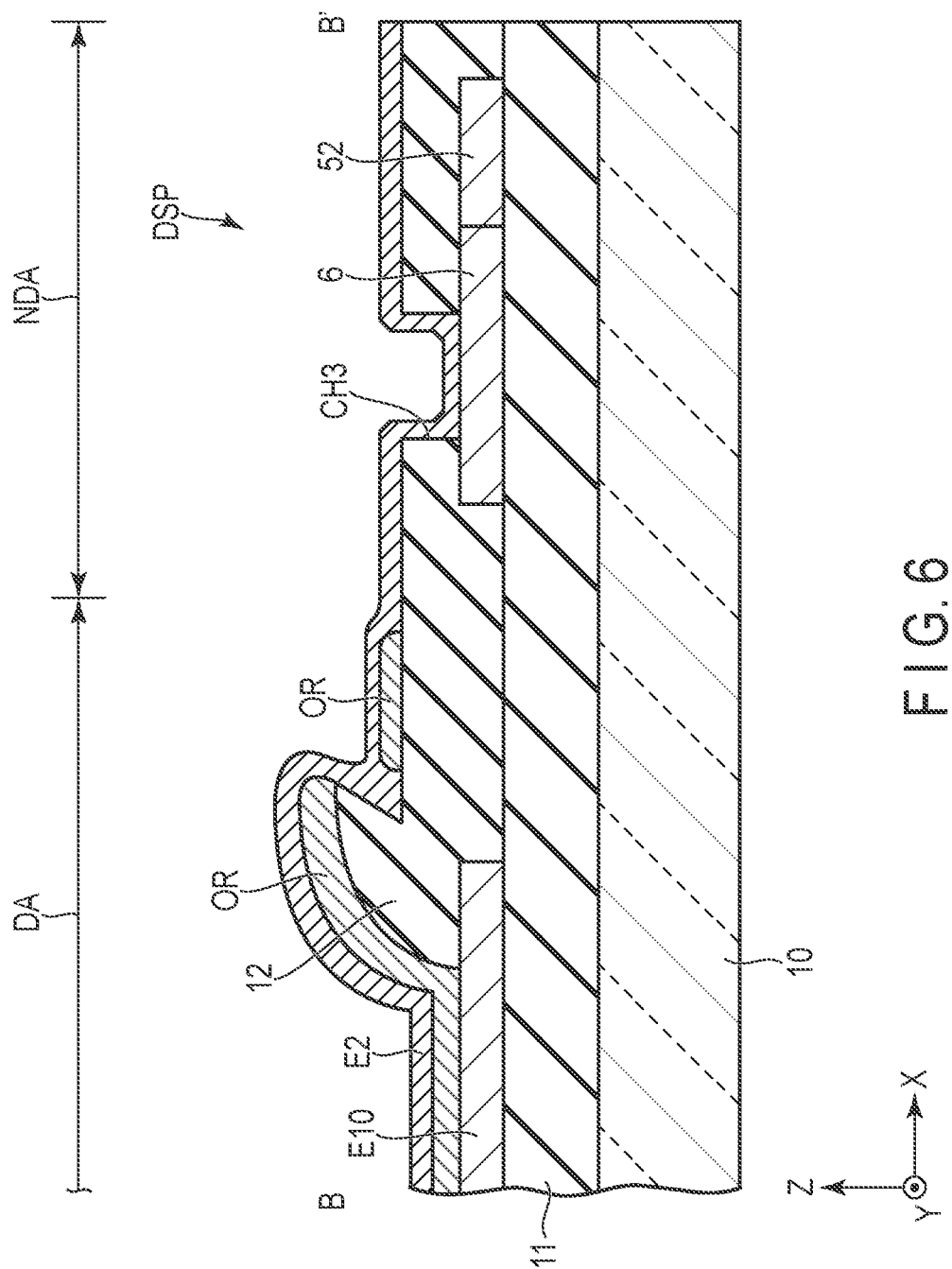
FIG. 6 is a cross-sectional view showing the display device taken along line B-B' shown in FIG. 1.

FIG. 6 is a cross-sectional view of the display device DSP taken along line B-B' shown in FIG. 1.

The peripheral electrode 6 and the power line 52 are located on the insulating layer 11. The insulating layer 12 covers the peripheral electrode 6 and power lines 52. The organic layer OR is not formed in the non-display area NDA. The upper electrode E2 covers the insulating layer 12 in the non-display area NDA and is connected to the peripheral electrodes 6 via a contact hole CH3 formed in the insulating layer 12. In the example illustrated in the figure, the peripheral electrode 6 and the power line 52 are located in the same layer as that of the lower electrode E10, but each may be located on a different layer from that of the lower electrode E10.

FIG. 7 is a cross-sectional view of the first modified example of the embodiment. The configuration shown in FIG. 7 is different from that of FIG. 3 in that the trench T12 penetrates the insulating layer 12 to the insulating layer 11.

In the example illustrated in the figure, the bottom surface BS corresponds to the upper surface of the insulating layer 11. Therefore, the third portion OR3 and the upper electrode E2 are in contact with the insulating layer 11 in the trench T12.

In the first modified example with such a configuration as described above, effects similar to those described above can be obtained.

Figure 8:
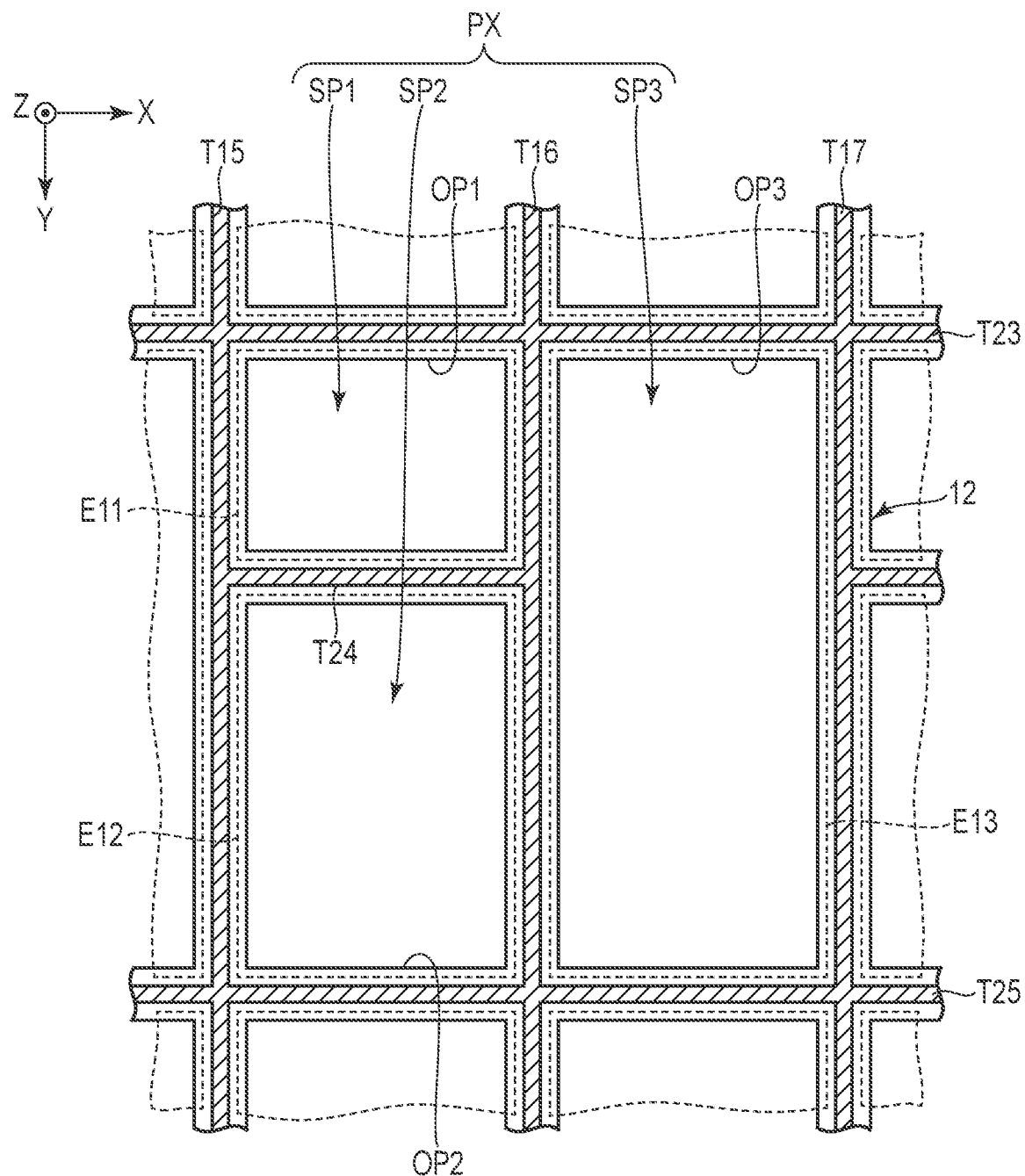
FIG. 8 is a plan view showing the second modified example of this embodiment.

FIG. 8 is a plan view of the second modified example of the embodiment. The configuration shown in FIG. 8 is different from that of FIG. 2 in the layout of the subpixel SP1, subpixel SP2 and subpixel SP3.

The lower electrodes E11 and E12 are aligned along the second direction Y. The lower electrodes E13 is aligned with the lower electrodes E11 and E12 along the first direction X.

The insulating layer 12 includes trenches T15, T16 and T17 extending in the second direction Y and aligned in the first direction X, and trenches T23, T24 and T25 extending in the first direction X and aligned in the second direction Y. The trench T16 is located between the first and second openings OP1 and OP2, and the third opening OP3. The trench T15 is located on an opposite side to the trench T16 while interposing the first and second openings OP1 and OP2 therebetween. The trench T17 is located on an opposite side to the trench T16 while interposing the third opening OP3 therebetween. The trench T23 is connected to the trenches T15 to T17. The trench T24 is connected to the trenches T15 and T16. The trench T25 is connected to the trenches T15 to T17. The trench T23 is located on an opposite side to the trench T25 while interposing the first opening OP1, the second opening OP2 and the third opening OP3 therebetween. The trench T24 is located between the first opening OP1 and the second opening OP2.

Each trench does not overlap a respective lower electrode adjacent thereto in planar view. In the first direction X, the lower electrodes E11 and E12 are located between the trenches T15 and T16, and the lower electrode E13 is located between the trenches T16 and T17. In the second direction Y, the lower electrode E11 is located between the trenches T23 and T24, the lower electrode E12 is located between the trenches T24 and T25, and the lower electrode E13 is located between the trenches T23 and T25.

The subpixels SP1 and SP2 are aligned along the second direction Y. The subpixels SP1 and SP3 are aligned along the first direction X. The subpixels SP2 and SP3 are aligned in the first direction X. The subpixel SP1 is formed into a rectangular shape elongated along the first direction X, and the subpixels SP2 and SP3 are each formed into a rectangular shape elongated along the second direction Y. The colors of light emitted from the subpixels SP1 and SP3 are different from each other. Further, the areas of the subpixels SP1 to SP3 are different from each other. The area of the subpixel SP2 is greater than that of the subpixel SP1, and the area of the subpixel SP3 is greater than that of the subpixel SP2. The area of the subpixel SP1 may be the same as that of the subpixel SP2.

In the second modified example with such a configuration as described above, effects similar to those described above can be obtained.

Figure 9:
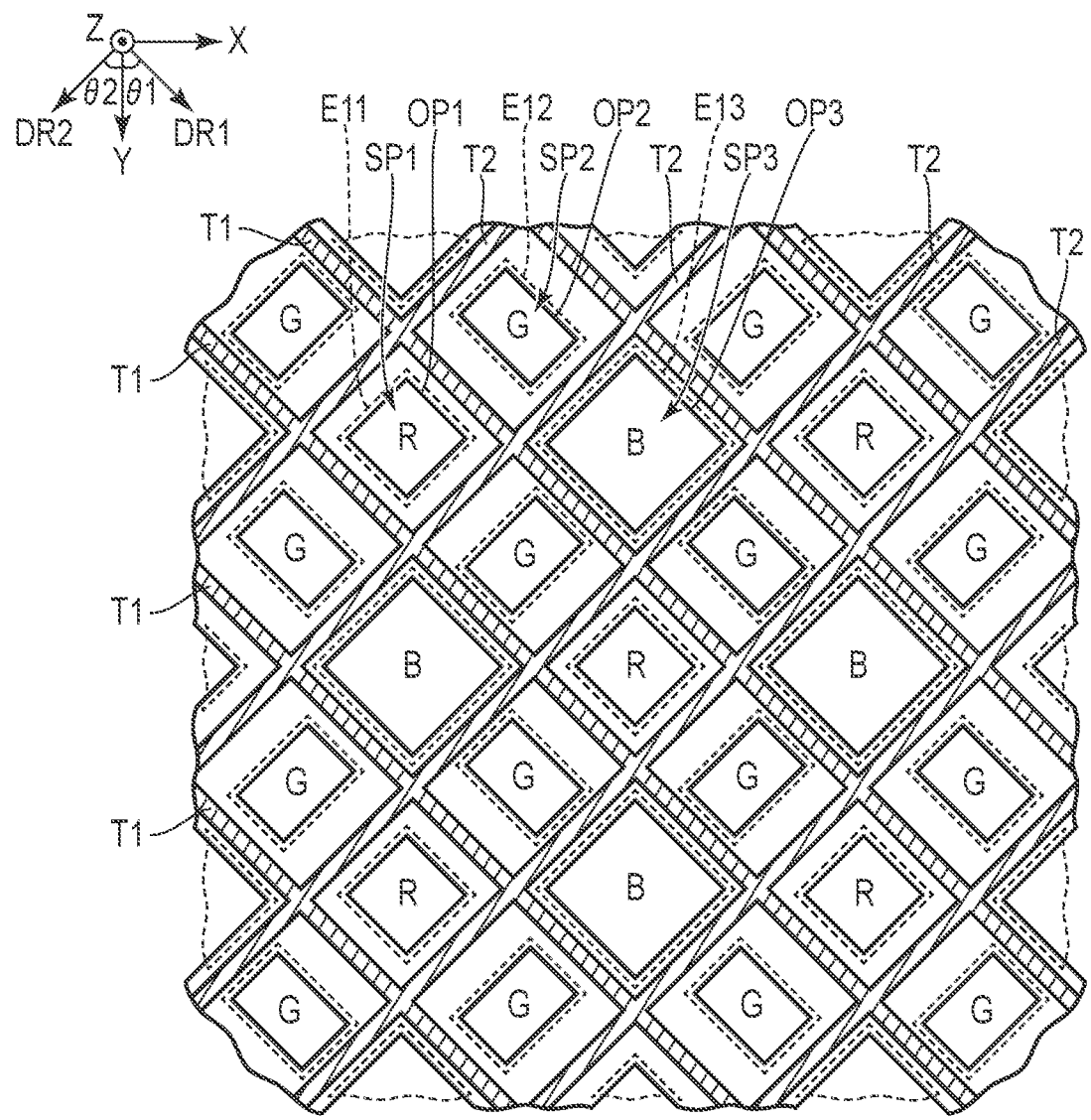
FIG. 9 is a plan view showing the third modified example of this embodiment.

FIG. 9 is a plan view of the third modified example of the embodiment. The configuration shown in FIG. 9 is different from that of FIG. 2 in the layout of the subpixel SP1, subpixel SP2 and subpixel SP3. A direction DR1 shown in FIG. 9 is inclined counterclockwise to the second direction Y at an angle θ1, and a direction DR2 shown in FIG. 9 is inclined clockwise to the second direction Y at an angle θ2.

The insulating layer 12 includes a plurality of trenches T1 extending along the direction DR1 and aligned along the direction DR2, and a plurality of trenches T2 extending along the direction DR2 and aligned along the direction DR1. A plurality of lower electrodes E11 and a plurality of first openings OP1 are located in a plurality of red subpixels SP1, respectively. A plurality of lower electrodes E12 and a plurality of second openings OP2 are located in a plurality of green subpixels SP2, respectively. A plurality of lower electrodes E13 and a plurality of third openings OP3 are located in a plurality of blue subpixels SP3, respectively.

The lower electrodes E11 and E12 are alternately arranged along the direction DR1 between each adjacent pair of trenches T1. The lower electrodes 512 and E13 are alternately arranged along the direction DR1 between each adjacent pair of trenches T1. The lower electrodes E11 and 512 are alternately arranged along the direction DR2 between each adjacent pair of trenches T2. The lower electrodes 512 and 513 are alternately arranged along the direction DR2 between each adjacent pair of trenches T2. Each of the trenches T1 and T2 does not overlap the lower electrode adjacent thereto in planar view.

The subpixels SP1 and SP3 are formed into a substantially square shape, some of the subpixels SP2 are formed into a substantially rectangular shape elongated along the direction DR1, and other subpixels SP2 are formed into a substantially rectangular shape elongated along the direction DR2. The areas of the subpixels SP1 to SP3 are different from each other. The area of the subpixels SP3 is greater than that of the subpixels SP1, and the area of the subpixels SP1 is greater than that of the subpixels SP2.

In the third modified example with such a configuration as described above, effects similar to those described above can be obtained.

As explained above, according to the present embodiments, it is possible to provide a display device which can suppress the degradation of display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a base;
   a first insulating layer disposed on the base;
   a first lower electrode and a second lower electrode, disposed on the first insulating layer;
   a second insulating layer disposed on the first insulating layer and including a first opening overlapping the first lower electrode, a second opening overlapping the second lower electrode, and a first trench located between the first opening and the second opening;
   an organic layer including a light-emitting layer; and an upper electrode covering the organic layer, wherein
the first trench includes a bottom surface and first and second side surfaces rising from the bottom surface,
an interval between the first side surface and the second side surface in an upper portion of the first trench is smaller than an interval between the first side surface and the second side surface in the bottom surface of the first trench, and
the organic layer includes:
a first portion covering the first lower electrode located in the first opening and covering the first surface of the second insulating layer located between the first trench and the first opening;
a second portion covering the second lower electrode located in the second opening and covering the second surface of the second insulating layer located between the first trench and the second opening; and
a third portion disposed on the bottom surface of the first trench and spaced apart from the first portion and the second portion.

2. The display device of claim 1, wherein
the first portion, the second portion and the third portion include light-emitting layers of the same color.

3. The display device of claim 1, wherein
the upper electrode covers the third portion inside the first trench and is in contact with the first side surface and the second side surface.

4. The display device of claim 1, wherein
the first portion comprises a first layer, a second layer and a third layer, stacked one on another, and is in contact with the first side surface,
an edge portion of the first layer is covered by the second layer in the first side surface,
an edge portion of the second layer is covered by the third layer in the first side surface, and
the light-emitting layer is one of the first layer, the second layer and the third layer.

5. The display device of claim 1, wherein
the second insulating layer further comprises:
a second trench located on an opposite side to the first trench while interposing the first opening therebetween; and
a third trench and a fourth trench, each connected to both the first trench and the second trench, and
the third trench is located on an opposite side to the fourth trench while interposing the first opening therebetween.

6. The display device of claim 1, further comprising:
a display area which displays images and a non-display area around the display area;
a power line located in the non-display area; and
a peripheral electrode located in the non-display area and electrically connected to the power line, wherein
the second insulating layer covers the peripheral electrode, and
the upper electrode is connected to the peripheral electrodes via a contact hole formed in the second insulating layer in the non-display area.

7. The display device of claim 1, wherein
the organic layer further comprises at least one of a hole injection layer, a hole transport layer, an electron injection layer, and an electron transport layer.

8. The display device of claim 1, wherein
the first trench penetrates the second insulating layer to the first insulating layer.

* * * * *